(12) United States Patent
Dubey

(10) Patent No.: US 9,685,979 B2
(45) Date of Patent: Jun. 20, 2017

(54) CIRCUITRY AND METHOD FOR GENERATING CYCLIC REDUNDANCY CHECK SIGNATURES

(71) Applicant: Texas Instruments Incorporated, Dallas, TX (US)

(72) Inventor: Aishwarya Dubey, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 76 days.

(21) Appl. No.: 14/720,516

(22) Filed: May 22, 2015

(65) Prior Publication Data

US 2016/0344410 A1  Nov. 24, 2016

(51) Int. Cl.
*H03M 13/11* (2006.01)
*H03M 13/09* (2006.01)

(52) U.S. Cl.
CPC .................. *H03M 13/091* (2013.01)

(58) Field of Classification Search
CPC .................................... H03M 13/11
USPC .......................... 714/758, 785, 737, 704, 799
See application file for complete search history.

(56) References Cited

U.S. PATENT DOCUMENTS

| | | | | |
|---|---|---|---|---|
| 3,976,864 A | * | 8/1976 | Gordon | G06F 11/277 714/45 |
| 4,608,691 A | * | 8/1986 | Lynch | G06F 11/277 714/732 |
| 5,668,947 A | * | 9/1997 | Batcher | G06F 11/277 714/30 |
| 2012/0159285 A1 | * | 6/2012 | Motwani | H03M 13/1102 714/767 |
| 2014/0136931 A1 | * | 5/2014 | Nakamura | H03M 13/05 714/785 |

* cited by examiner

*Primary Examiner* — Fritz Alphonse
(74) *Attorney, Agent, or Firm* — Lawrence J. Bassuk; Charles A. Brill; Frank D. Cimino

(57) ABSTRACT

Parallel CRC signature circuitry provides a plurality of modules in which a byte of parallel input data is receivable by each module. Each module includes a parallel data input for receiving a byte of parallel input data. Three levels of multiplexors are coupled to the parallel data input. A decoder decodes a polynomial to selection data. The selection data selects the inputs passed by the three levels of multiplexors, and each of the modules generates one byte of the parallel CRC signature free of a clock signal.

20 Claims, 3 Drawing Sheets

CIRCUITRY AND METHOD FOR GENERATING CYCLIC REDUNDANCY CHECK SIGNATURES

BACKGROUND

Cyclic redundancy check (CRC) systems confirm that data transferred from a source to a destination was not corrupted during the data transfer. A CRC-enabled device calculates a short, fixed-length binary sequence, known as the check value or CRC, for each block of data to be sent or stored. The CRC is appended to the data block to form a codeword. When a codeword is received or read, the receiving device either compares its check value with one freshly calculated from the data block, or equivalently, performs a CRC on the whole codeword and compares the resulting check value with an expected residue constant. If the check values do not match, then the block contains a data error. Otherwise, the data is assumed to be error-free.

Many CRC codes require the definition of a generator polynomial, which becomes the divisor in a polynomial long division. One feature of a hardware CRC calculation system is a signature generating division polynomial G(x). The polynomials G(x) that are required for CRC calculations are not standardized. For example, different sensor types, such as image sensors and radar, have their own polynomials. Different communication protocols such as universal serial bus (USB), peripheral component interconnect express (PCIe), and ethernet, each have their own polynomial schemes.

CRC systems are either serial implementations, which have a limitation on the throughput per cycle, or parallel implementations with limited polynomial support. This puts severe restrictions on using the CRC hardware accelerator modules for checking data consistency. For example, either the signature generating polynomial is not programmable or the implementation of the CRC system is done as a serial shift register that takes "N" clock cycles to calculate the signature for "N" bit stream.

SUMMARY

Circuitry and methods for generating parallel CRC signature bits are disclosed. An embodiment of the circuitry includes a data input for receiving parallel input data in which the parallel input data has a plurality of input bits. The circuitry further includes a plurality of first multiplexors in which each of the first plurality of multiplexors has a plurality of first multiplexor inputs. At least one of each of the first multiplexor inputs is coupled to the data input and at least one of each of the first multiplexor inputs is coupled to the circuitry output for receiving CRC signature bits. Further included is a plurality of second multiplexors in which each of the plurality of second multiplexors has a first input coupled to an output of one of the first plurality of multiplexors and a second input coupled to a predetermined voltage. Further included is a plurality of third multiplexors, each of the plurality of third multiplexors has inputs coupled to outputs of the second plurality of multiplexors by exclusive OR (XOR) gates, the outputs of the third plurality of multiplexors are coupled to the circuitry output. A decoder decodes a polynomial to selection data for selecting the inputs passed by the multiplexors. The parallel CRC signature bits are generated at the circuitry output in a single clock pulse.

DETAILED DESCRIPTION

Parallel cyclic redundancy check (CRC) generation logic with a divisor polynomial that is programmable is disclosed herein. In some examples, the CRC generation logic is implemented during a single clock pulse. The CRC generation logic generates a CRC signature, sometimes referred to as the modulo signature, that is used to check the accuracy of transmitted data.

Figure 1:
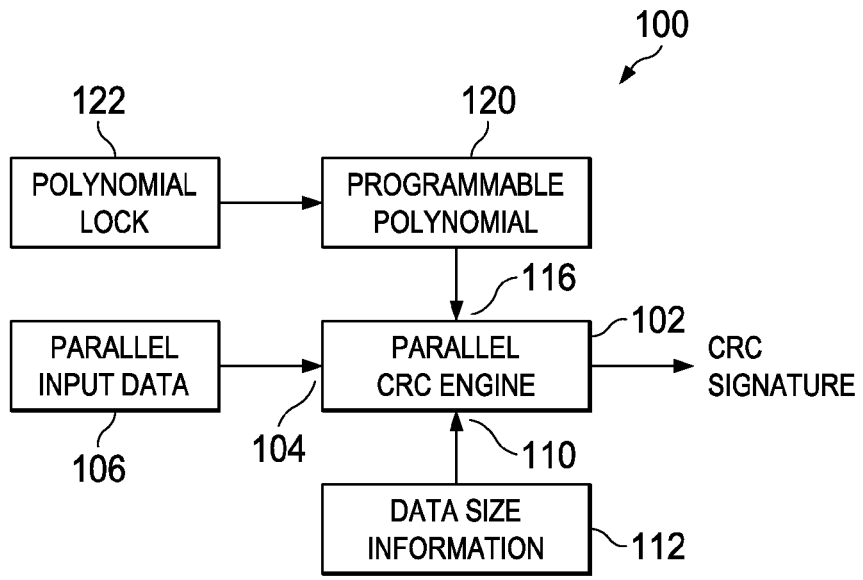
FIG. 1 is a block diagram of a system for generating a CRC signature.

FIG. 1 is a block diagram of an embodiment of a system 100 that generates a CRC signature. The system 100 includes a programmable CRC engine 102 that generates the CRC signature in response to input data and a polynomial as described herein. The CRC engine 102 has an input 104 that receives parallel input data 106. The parallel input data 106 is transmitted from a data transmitting device (not shown) and may be in the form of many different protocols.

The CRC engine 102 has an input 110 that receives data size information 112, which is an indication as to the size of the data transmitted by way of the parallel input data 106. The data size information 112 is one of the factors that may be employed by the CRC engine 102 to determine the CRC signature as described in greater detail below. The CRC engine 102 has an input 116 that receives polynomial data, which is sometimes referred to as the divisor polynomial, from a programmable polynomial block 120. The polynomial data sets the polynomial used by the CRC engine 102 to generate the CRC signature. The polynomial block 120 receives polynomial lock data 122 indicating whether or not the polynomial may change. The polynomial lock data 122 ensures that there is no over-writing of the polynomial during generation of the CRC signature.

The system 100 receives a polynomial that is used to generate the CRC signature by way of the programmable polynomial 120. The polynomial is sometimes referred to as G(x). Different devices use different polynomials for CRC signature generation, so the system 100 accommodates the different polynomials by enabling the CRC engine 102 to be programmed based on the different polynomials. For example, radar, imaging, universal serial bus (USB), and ethernet typically all have their own unique polynomials. Examples of polynomials include CRCs of the International Telegraph and Telephone Consultative Committee (CCITT) CRC-CCITT (8, 16, 32, 64), mobile industry processor interface (MIPI) CRC, and CRC-12. When the polynomial has been received, the polynomial lock 122 transmits a signal that prevents the polynomial from being overwritten.

The CRC engine 102 receives polynomial data based on the polynomial. The CRC engine 102 also receives the parallel input data along with the data size information 112. The CRC engine 102 then generates the CRC signature in one clock pulse by applying the polynomial data to the parallel input data 106 as described below.

Figure 2:
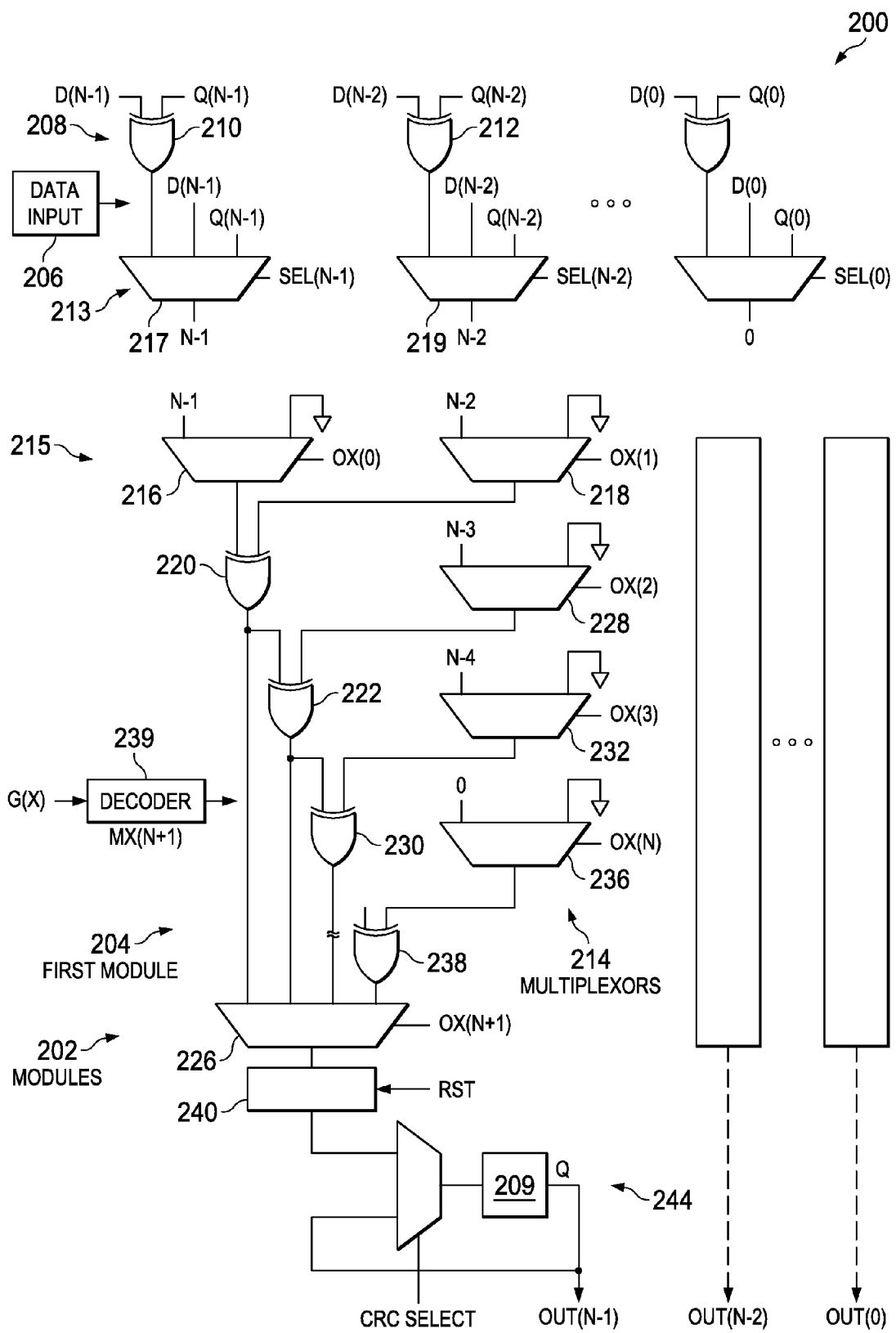
FIG. 2 is a schematic diagram of a circuitry implementing the CRC system of FIG. 1.

Reference is made to FIG. 2, which is a schematic diagram of an example of a circuit 200 implementing the CRC engine 102 of FIG. 1. The circuit 200 includes a plurality of modules 202, in which each of the modules 202 generates one bit of the CRC signature, which are referenced as OUT(0) through OUT(N−1). Accordingly, the CRC signature has N bits. In some embodiments of the circuit 200, specific modules 202 can be activated and deactivated to accommodate CRC signatures having different lengths or numbers of bits. The circuit 200 has a data input 206 that receives parallel input data having N bits, in which the input data may have virtually any number of bits. The input data bits are referred to as D(0) through D(N−1). The data size information 112, FIG. 1, includes information as to the number of bits in the input data and is received within the circuit 200 as described below. The data size information 112 relates to the number of bits in the input data, which also determines the number of modules 202 that are required to be activated during the CRC signature generation.

Reference is made to a first module 204 that is representative of all the modules 202 in the circuit 200. The input data is received at a data input 206 and is transmitted to first inputs of a plurality of exclusive OR (XOR) gates 208. The second inputs of the XOR gates 208 are coupled to outputs of flip/flops 209 and are referenced as Q(0) through Q(N−1), which are also the output bits OUT(0) through OUT(N−1). The outputs of the XOR gates 208 are input to multiplexors 213. The multiplexors 213 have two other inputs of data D and output Q. A first input multiplexor 217 has inputs of the output of the XOR gate 210, the data input D(N−1), and the output Q(N−1). A second multiplexor 219 has inputs of the output of the XOR gate 212, the input data D(N−2), and the output Q(N−2).

The circuit 200 further includes a plurality of intermediate multiplexors 214. In the example of FIG. 2, the multiplexors 214 are arranged in rows for the purpose of illustration, in which the multiplexor(s) in each successive row has an input from a different one of the multiplexors 213. The outputs of the multiplexors 213 are coupled to inputs of the multiplexors 214. The multiplexors 214 each have two inputs, in which one input is coupled to the output of a multiplexor 213 and the other input is coupled to a known voltage, which in the example of FIG. 2 is ground for a logic zero input.

The first module 204 has two multiplexors in a first row 215 of multiplexors 214 that are referred to as a first multiplexor 216 and a second multiplexor 218. The multiplexor 217 selects data from the output of the XOR gate 210, D(N−1), and Q(N−1) and outputs the selection to an input of the first multiplexor 216. The other input of the multiplexor 216 is coupled to ground for a logic zero input. The multiplexor 219 selects data from the XOR gate 212, D(N−2), and Q(N−2) and outputs the selection to an input of the second multiplexor 218. The other input of the multiplexor 218 is coupled to ground for a logic zero input. The multiplexors in the first rows of the other modules are coupled to the outputs of the other multiplexors 213.

The outputs of the first and second multiplexors 216 and 218 are coupled to the inputs of an XOR gate 220. The output of the XOR gate 220 is coupled to a first input of an XOR gate 222 and one of a plurality of inputs of an output multiplexor 226, which is described in greater detail below. The second input of the XOR gate 222 is coupled to the output of a multiplexor 228. The inputs of the multiplexor 228 are coupled to ground and one of the multiplexors 213 outputting N−3 data. The selection input of the multiplexor 228 is coupled to the polynomial decoder 239 and is referenced as 0X(2), in which the selection input is a single bit of one or zero.

The output of the XOR gate 222 is coupled to an input of the output multiplexor 226 and a first input of an XOR gate 230. The second input of the XOR gate 230 is coupled to the output of a multiplexor 232. The multiplexor 232 has two inputs, one coupled to ground and the other coupled to the multiplexor 213 outputting N−4 data. The selection for the multiplexor is referred to as OX(3) and is a single bit. The pattern of multiplexor and XOR gate coupling continues to a multiplexor 236 that has two inputs that are coupled to ground and the multiplexor 213 outputting the zero data. The selection input for the last multiplexor 236 is referred to as OX(N) and is a single bit. The output of the last multiplexor 236 is coupled to a first input of an XOR gate 238. The output of the XOR gate 238 is coupled to an input of the output multiplexor 226.

The selection of the input to be passed to the outputs of the multiplexors 213, 214, and 226 is based on the polynomial G(x). There are N numbers of modules 202, each having N+1 multiplexors, which may vary depending on the multiplexor arrangement. A decoder 239 decodes the polynomial G(x) to a plurality of outputs or numbers, in which each of the modules corresponds to one of the numbers, which are sometimes referred to as words. For reference, the outputs are formatted as MX(N+1), where M is the module number (0 to N−1). As shown in FIG. 2, the selection inputs of the multiplexors in the first module 204 are coupled to outputs 0X(0) to 0X(N+1) of the decoder 239. The selection input of the first multiplexor 216 is coupled to the output 0X(0) of the decoder 239 and the selection input of the second multiplexor 218 is coupled to the 0X(1) output of the decoder 239. The selection input SEL of the multiplexors 213 may be determined by the decoder 239. In some examples, the single multiplexors 213 are configured as two two-input multiplexors, so the number of bits generated by the decoder 239 may have to be adapted for this multiplexor arrangement.

The output multiplexor 226 passes one of the outputs from the XOR gates described above. The output selection is in response to an output from the polynomial decoder 239 referred to as 0X(N+1). The output of the output multiplexor 226 is coupled to a flip/flop 240 that functions as a latch. The flip/flop 240 passes the output of the output multiplexor 226 until a reset signal is received by the flip/flop 240. In the example of FIG. 2, the output of the flip/flop 240 is coupled to a latch 244 that outputs the OUT(N−1) bit of the CRC signature, which is also referred to as Q(N−1), in response to a CRC select signal. The latch 244 prevents the bits of the CRC signature from changing states prior to transmission of the CRC select signal. The output of the circuit 200 is a parallel output that is the CRC signature represented by bits OUT(0) to OUT(N−1).

The circuit 200 includes the polynomial decoder 239 that receives the polynomial and decodes it for the multiplexor selection described above. An example of a polynomial based on a 64 bit data input is $G(x)=x^4+x^3+1$. In such an example, the data bits DATA(0), DATA(2), and DATA(3) are processed to generate the CRC signature. The data size, which is the number of bits in the input data is received by way of the data size information 112, FIG. 1, and may be received with the data input 206. The data size information is one of the factors that determine the number of output multiplexors that are to be activated in each of the modules 202 during CRC signature generation.

Figure 3:
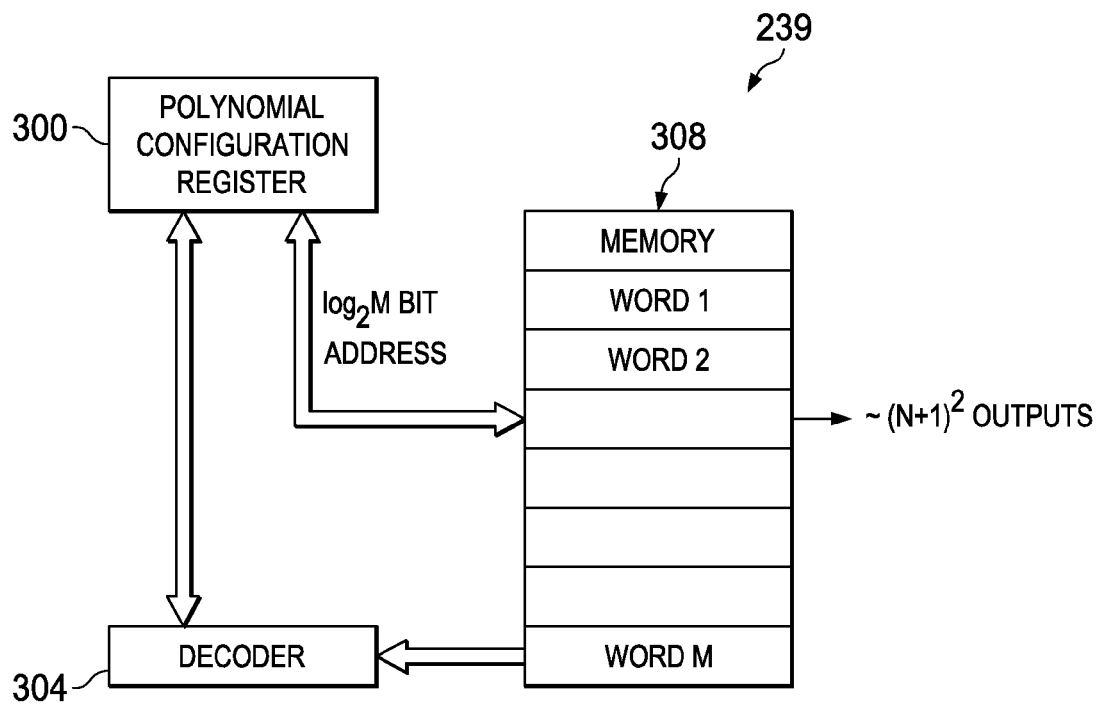
FIG. 3 is a block diagram of an embodiment of a polynomial decoder.

FIG. 3 is a block diagram of an example of the polynomial decoder 239. The polynomial decoder 239 includes a polynomial configuration register 300 that receives polynomials. A decoder 304 decodes the polynomials to a plurality of bits, which are referred to as the above-described numbers or words. The words are stored in a memory device 308, such as a random access memory. The polynomial configuration register 300 tracks the locations of the words to specific addresses in the memory device 308. The polynomial decoder 239 may store a plurality words that are the decoded bits of known or frequently used polynomials. Other polynomials that need to be decoded are decoded by the decoder 304 and their respective bits are stored in the memory device 308. The bits of the words are received by the multiplexors 213, 214, and 226 to pass specific inputs corresponding to the received bits. More specifically, the polynomial decoder 239 generates the output MX(N+1) that provides selection input values to the multiplexors 214.

Having described the circuitry 200, its operation will now be described. The polynomial G(x) that is used to generate the CRC signature is input to the polynomial decoder 239. If the polynomial G(x) has previously been decoded and its respective word is stored in the memory device 308, the polynomial configuration register 300 transmits an address corresponding to the word to the memory device 308. The memory device 308 outputs the word to the multiplexors 213, 214, and 226. If the polynomial G(x) has not been previously decoded, the decoder 304 decodes the polynomial G(x) and stores the word in the memory device 308. The polynomial configuration register 300 tracks the location of the word in the memory device 308.

When the decoder 239 decodes the polynomial G(x), it outputs selection numbers, which are the outputs MX(N+1), to all of the multiplexors 213, 214, and 226. The selection numbers are input to the select inputs of the multiplexors 213, 214, and 226. In some embodiments, the decoder 239 may activate only specific output multiplexors 226 in the modules 202 depending on the number of bits in the CRC signature. For example, if the CRC signature is only three bits, then only three of the modules 202 and the output multiplexors 226 located therein are required to be activated.

The circuit 200 functions by receiving the polynomial G(x) into the decoder 239. In addition to the polynomial G(x), the circuit 200 also receives the parallel input data at the data input 206. A component within the circuit 200, such as the data input 206, may also receive the data size information. In some embodiments, the data size information is calculated by the circuit 200. The decoded polynomial is transmitted to the selection inputs of the multiplexors 213, 214, and 226 in the form of MX(N+1) as described above. Accordingly, the inputs that are to be passed by the multiplexors 213, 214, and 226 are set and the input data D(0) to D(N) is input to the XOR gates 208. In some embodiments, the inputs of the multiplexors 213, 214, and 226 are passed to the outputs upon receipt of the selection words MX(N+1) from the decoder 239. The output for each bit of the CRC signature is present at the input to the flip/flop 240. This output of the flip/flop 240 is maintained until a subsequent signal is received by the flip/flop 240. The latch 244 outputs the bits of the CRC signature upon receipt of a CRC select signal. The output Q is coupled to the input to process the subsequent CRC signature bit. The output Q is held and the selection words are transmitted to the multiplexors 213, 214, and 226, so the subsequent bit of the CRC signature is present at the input to the flip/flop 240 as soon as the input data is received. The above-described process continues as the data is transmitted, so CRC signatures are continually generated in parallel.

Figure 4:
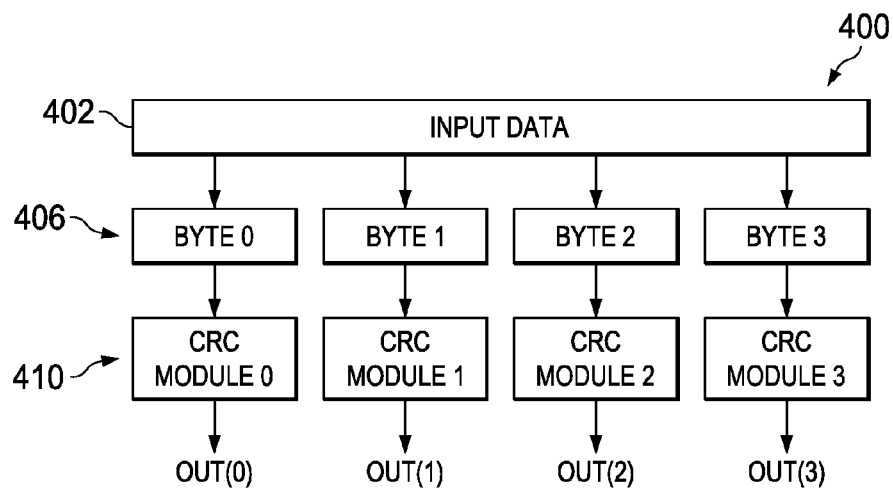
FIG. 4 is a schematic diagram of another circuit implementing the CRC system of FIG. 1.

FIG. 4 is another embodiment of a circuit 400 for generating a CRC signature. The circuit 400 is a combination of parallel and serial generation mechanisms for the CRC signature. The circuit 400 includes a data input 402 that receives the parallel input data as described above. The input data is portioned into a plurality of data bytes 406, in which each of the data bytes 406 contains a plurality of data bits. The example circuit 400 includes four data bytes 406 that are referred individually as byte 0, byte 1, byte 2, and byte 3. In one example, the input data has sixteen bits, so each of the data bytes 406 has four bits. In a second example, the data bytes 406 each have eight bits, so only byte 0 and byte 1 are loaded with the sixteen bit input data. In a third example, the input data has sixty-four bits, so each of the data bytes 406 has sixteen bits. Other embodiments of the circuit 400 may portion the input data 402 into any number of data bytes.

The data bytes 406 are each coupled to one of a plurality of CRC modules 410 that are individually referenced as CRC module 0, CRC module 1, CRC module 2, and CRC module 3. The individual CRC modules 410 are identical or substantially similar to the CRC module 204 of FIG. 2. Each of the CRC modules 410 generates a bit of the CRC signature based on their corresponding data bytes 406 and a polynomial. The circuit 400 may take several clock pulses to generate a CRC signature. For example, if the data bytes 406 each have four bits, then each CRC module 410 has to generate four CRC signature bits per parallel data input. Accordingly, the parallel data is received, and then each CRC module 410 generates four bits of the CRC signature, which takes four cycles of the CRC modules 410. Although the circuit 400 is slower, it requires much fewer components than the embodiments in which each CRC module only generates a single bit.

Figure 5:
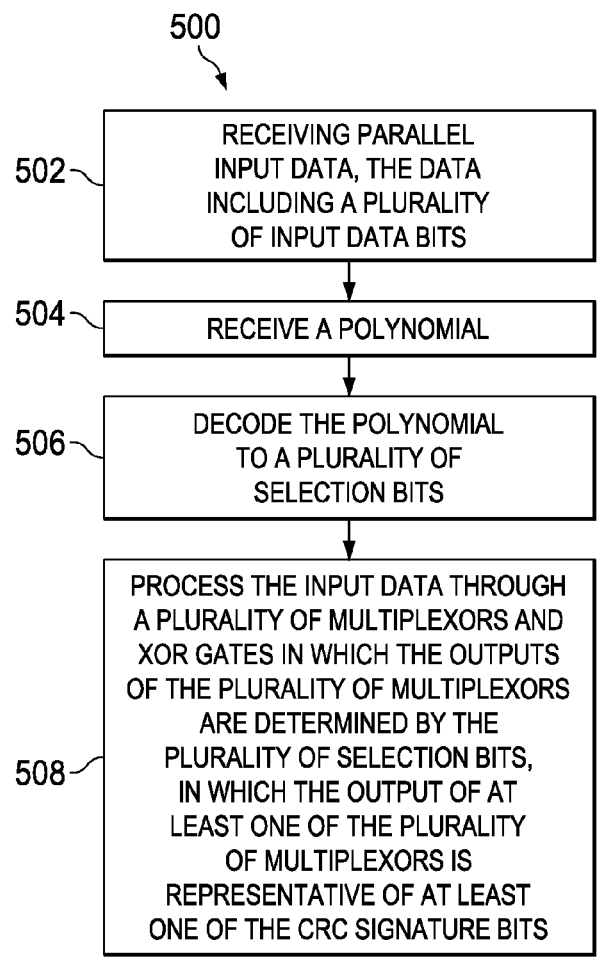
FIG. 5 is a block diagram illustrating an example method of generating a CRC signature.

An example method of generating a CRC signature bits based on the above-described circuits is shown in the flow chart 500 of FIG. 5. In step 502 parallel input data is received, the data includes a plurality of input data bits and in step 504, a polynomial is received. In step 506, the polynomial is decoded to a plurality of selection bits. In step 508, the input data is processed through a plurality of multiplexors and XOR gates in which the outputs of the plurality of multiplexors are determined by the plurality of selection bits in which the output of at least one of the plurality of multiplexors is representative of at least one of the CRC signature bits.

While some examples of CRC systems have been described in detail herein, it is to be understood that the inventive concepts may be otherwise variously embodied and employed and that the appended claims are intended to be construed to include such variations except insofar as limited by the prior art.

What is claimed is:

1. Circuitry for generating parallel CRC signature bits, the circuitry comprising:

a data input for receiving parallel input data, the parallel input data having a plurality of input bits;

a plurality of first multiplexors, each of the first multiplexors having a plurality of first multiplexor inputs, at least one of each of the first multiplexor inputs being coupled to the data input and at least one of each of the first multiplexor inputs being coupled to a circuitry output for receiving CRC signature bits;

a plurality of second multiplexors, each of the plurality of second multiplexors having a first input coupled to an output of one of the first plurality of multiplexors and a second input coupled to a predetermined voltage;

a plurality of third multiplexors, each of the plurality of third multiplexors having inputs coupled to outputs of the second plurality of multiplexors by exclusive OR (XOR) gates, the outputs of the third plurality of multiplexors being coupled to the circuitry output; and a decoder for decoding a polynomial to selection data for selecting the inputs passed by the multiplexors;

in which the parallel CRC signature bits are generated at the circuitry output in a single clock pulse.

2. The circuitry of claim 1 including a first plurality of XOR gates, in which a first input of each of the first plurality of XOR gates is coupled to one bit of the input data, in which a second input of each of the first plurality of XOR gates is coupled to the circuitry output, and in which the outputs of the first plurality of XOR gates are coupled to inputs of the first plurality of multiplexors.

3. The circuitry of claim 1 in which the predetermined voltage is a logic zero.

4. The circuitry of claim 1, in which the predetermined voltage is ground.

5. The circuitry of claim 1, in which the first plurality of multiplexors includes one multiplexor for each input bit.

6. The circuitry of claim 1, in which the second plurality of multiplexors includes a first multiplexor and a second multiplexor and in which the outputs of the first multiplexor and the output of the second multiplexor are coupled to inputs of an XOR gate.

7. The circuitry of claim 1 including a plurality of latches coupled to the outputs of the third plurality of multiplexors.

8. The circuitry of claim 7, in which the outputs of the plurality of latches are coupled to inputs of the first plurality of multiplexors.

9. The circuitry of claim 7, in which the latches store signature CRC bits at their inputs and pass the CRC signature bits to their outputs during the single clock pulse.

10. The circuitry of claim 1, in which the decoder includes a polynomial configuration register for registering the location of selection data for at least one polynomial stored in a memory device.

11. The circuitry of claim 1, in which the selection data is a plurality of selection bits.

12. The circuitry of claim 1 in which at least one byte of CRC signature bits is generated in a single clock pulse and in which the at least one byte includes at least two CRC signature bits.

13. A method for generating CRC signature bits, the method comprising:
   receiving parallel input data, the parallel input data including a plurality of input data bits;
   receiving a polynomial;
   decoding the polynomial to a plurality of selection bits; and
   processing the input data through levels of multiplexors and XOR gates in which the outputs of the multiplexors are determined by the plurality of selection bits, in which the output of at least one of the levels of multiplexors is representative of at least one of the CRC signature bits, and the processing occurs free of a clock signal.

14. The method of claim 13 including storing at least one of the selection bits corresponding to at least one polynomial, in which the decoding includes retrieving the selection bits corresponding to the at least one polynomial.

15. The method of claim 13 including inputting each input data bit and a corresponding previous CRC signature bit to a first plurality of XOR gates in which the outputs of the first plurality of XOR gates are coupled to inputs of a first level of multiplexors.

16. The method of claim 15 including receiving the plurality of input data bits at the inputs of the first level of multiplexors.

17. The method of claim 15 including outputting outputs of the first level of multiplexors to the inputs of a second level of multiplexors.

18. The method of claim 17 including outputting the output of the second level of multiplexors to inputs of a third level of multiplexors in which the outputs of the third level of multiplexors are coupled to the CRC signature bits.

19. The method of claim 18 including outputting the outputs of the third level of multiplexors to the inputs of the first level of multiplexors.

20. Circuitry for generating a parallel CRC signature, the circuitry comprising:
   a plurality of modules in which a byte of parallel input data is receivable by each module, each module including:
   a parallel data input for receiving a byte of parallel input data;
   levels of multiplexors coupled to the parallel data input; and
   a decoder for decoding a polynomial to selection data, in which the selection data selects the inputs passed by the levels of multiplexors, in which each of the modules generates one byte of the parallel CRC signature free of a clock signal.

* * * * *